United States Patent
Kim et al.

(10) Patent No.: US 7,629,262 B2
(45) Date of Patent: Dec. 8, 2009

(54) METHOD OF FORMING A LOWER ELECTRODE OF A CAPACITOR

(75) Inventors: Jung-Wook Kim, Gyeonggi-do (KR); Young-Joo Cho, Gyeonggi-do (KR)

(73) Assignee: Samsung Electronic Co., Ltd., Suwon-si, Gyeonggi-do (KR)

( * ) Notice: Subject to any disclaimer, the term of this patent is extended or adjusted under 35 U.S.C. 154(b) by 274 days.

(21) Appl. No.: 11/282,193

(22) Filed: Nov. 18, 2005

(65) Prior Publication Data

US 2006/0115946 A1 Jun. 1, 2006

(30) Foreign Application Priority Data

Nov. 30, 2004 (KR) .................. 10-2004-0099082

(51) Int. Cl.
*H01L 21/302* (2006.01)
*H01L 21/461* (2006.01)

(52) U.S. Cl. .................. 438/735; 438/238; 438/740; 257/E21.17; 257/E21.231; 257/E21.238; 257/E21.245; 257/E21.246; 257/E21.267; 257/E21.293; 257/E21.278; 257/E21.645; 257/E21.646

(58) Field of Classification Search .................. 438/239, 438/253, 396, 694, 700, 702, 703, 761, 778, 438/785, 787, 791, 388, 395, FOR. 220, FOR. 430, 438/238, 735, 736, 740, 742, 743, 744, 680, 438/769, 954
See application file for complete search history.

(56) References Cited

U.S. PATENT DOCUMENTS

| | | | | |
|---|---|---|---|---|
| 5,240,871 A | * | 8/1993 | Doan et al. | 438/397 |
| 5,266,512 A | * | 11/1993 | Kirsch | 438/238 |
| 5,763,286 A | | 6/1998 | Figura et al. | |
| 6,211,009 B1 | * | 4/2001 | Carpenter | 438/254 |
| 6,461,910 B1 | * | 10/2002 | Park et al. | 438/240 |
| 6,461,911 B2 | * | 10/2002 | Ahn et al. | 438/253 |
| 6,924,189 B2 | * | 8/2005 | Kwon | 438/239 |
| 7,071,071 B2 | * | 7/2006 | Iijima et al. | 438/396 |
| 2004/0084712 A1 | | 5/2004 | Lin et al. | |
| 2004/0125472 A1 | * | 7/2004 | Belt | 359/847 |
| 2004/0266102 A1 | * | 12/2004 | Kwon | 438/254 |
| 2005/0087879 A1 | * | 4/2005 | Won et al. | 257/758 |
| 2005/0176210 A1 | * | 8/2005 | Kim et al. | 438/386 |

* cited by examiner

*Primary Examiner*—David Nhu
(74) *Attorney, Agent, or Firm*—Marger Johnson & McCollom, P.C.

(57) ABSTRACT

In an embodiment, a method of forming a lower electrode of a capacitor in a semiconductor memory device includes etching a mold oxide layer to have at a cylindrical structure, resulting in an electrode with increased surface area. The cylindrical structure may have more than one radius. This increased surface area results in an increased capacitance. An excessive etch phenomenon, which occurs because a sacrificial oxide layer is etched at a higher rate than the mold oxide layer, is avoided.

22 Claims, 9 Drawing Sheets

METHOD OF FORMING A LOWER ELECTRODE OF A CAPACITOR

CROSS-REFERENCE TO RELATED APPLICATION

This application claims the benefit of Korean Patent Application No. 10-2004-0099082, filed Nov. 30, 2004, the disclosure of which is hereby incorporated herein by reference in its entirety.

BACKGROUND OF THE INVENTION

1. Technical Field

The present invention relates to a method of fabricating a semiconductor memory device, and more particularly, to a method of forming a lower electrode of a capacitor in a semiconductor memory device.

2. Discussion of Related Art

Generally, to increase a capacitor's capacitance, the surface area of the capacitor's electrodes must be increased, or high-k dielectrics may be used. A dielectric material often used includes $SiO_2$ (permittivity: 3.9) and $Si_3N_4$ (permittivity: 7.0). A high-k dielectric material may include $TiO_2$ (70~80), $Ta_2O_5$ (24~26), $SrTiO_3$ (200~300), and BST (300~500). However, the high-k dielectric materials have many problems to be solved before being employed because they tend to cause a high leakage current.

As a method of increasing the surface area of a capacitor electrode, one may increase an effective area by forming recesses on the surface of the capacitor's electrode, and may also increase an effective area by structural characteristics. One method of forming recesses on the surface of a capacitor electrode is to form hemispherical grains on the surface of polysilicon by appropriately controlling deposition parameters. The structural method may be classified into a stack structure and a trench structure. The stack structure includes a fin structure, a cylinder structure, and a multilayer vertical stack structure.

A capacitor structure most commonly used as a high capacitance, highly-integrated memory structure is a cylinder structure having hemispherical grains. The cylinder structure is formed by a photolithography process after a sacrificial oxide layer is deposited. However, a portion of a lower structure for forming a capacitor lower electrode on a semiconductor substrate may be etched during processes of patterning and etching the sacrificial oxide layer, using a mask. That is, the sacrificial oxide layer interposed between a conductive layer deposited to form the lower electrode has a different etch rate from that of a mold oxide layer. Since an etch rate of the sacrificial oxide layer is higher, the conductive layer is exposed to an etch solution, and the etch solution is absorbed by the surface of the conductive layer and reaches a lower interlayer insulating layer. Thus, the etch solution etches the lower interlayer insulating layer, thereby causing an excessive etch phenomenon.

Hereinafter, a conventional method of forming a lower electrode of a capacitor involved with the excessive etch phenomenon will be explained in reference to attached drawings.

Figure 1A:
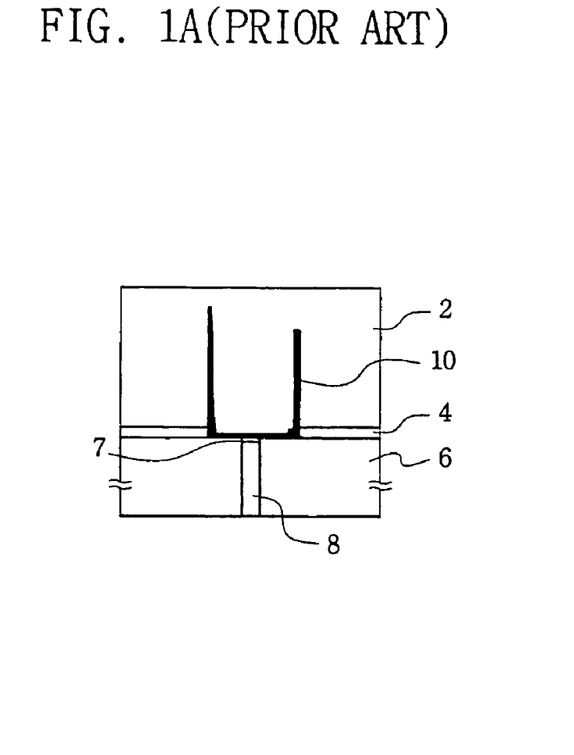
FIG. 1A is a cross-sectional view illustrating that, in the conventional art, a first conductive layer is deposited on the surface of a hole formed after a mold oxide is etched.
Figure 1B:
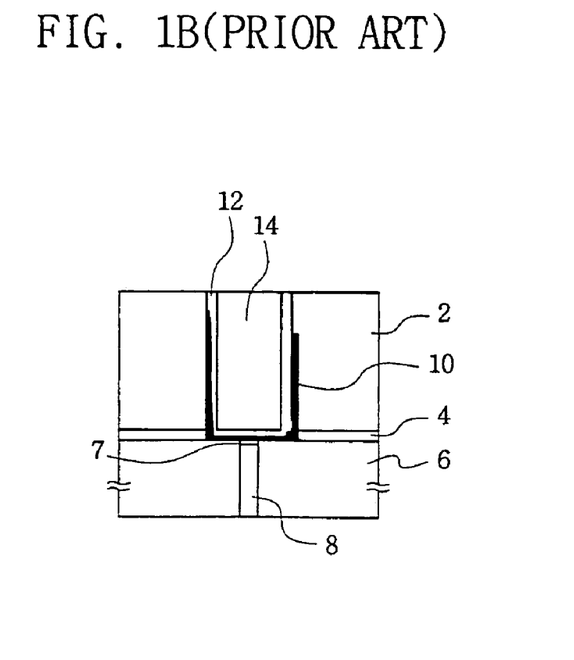
FIG. 1B is a cross-sectional view illustrating that, in the conventional art, a second conductive layer is deposited on the surface of the first conductive layer of FIG. 1A, and a sacrificial oxide layer is interposed between the second conductive layer.
Figure 1C:
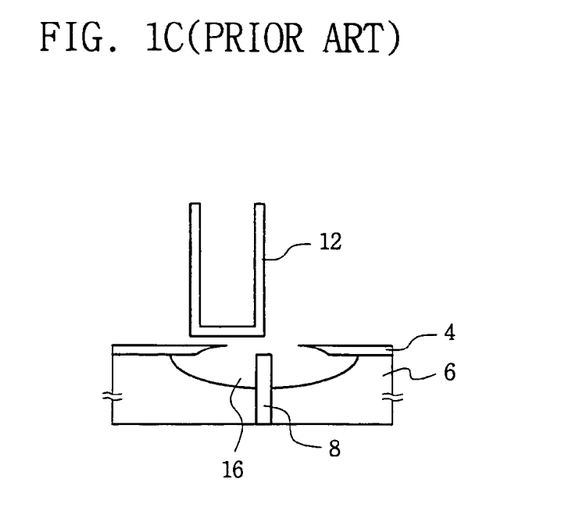
FIG. 1C is a cross-sectional view illustrating that, in the conventional art, an excessive etch phenomenon occurs due to differences in etch rates of the sacrificial oxide layer and the mold oxide of FIG. 1B.

FIGS. 1A to 1C are cross-sectional views sequentially illustrating a mechanism of the excessive etch phenomenon in a conventional method of forming a capacitor lower electrode. FIG. 1A is a cross-sectional view illustrating that an etch hole is formed after a mold oxide is etched, and a first conductive layer is deposited on the surface of the etch hole. FIG. 1B is a cross-sectional view illustrating that a second conductive layer is deposited on the surface of the first conductive layer of FIG. 1A, and a sacrificial oxide layer is interposed between the two conductive layers. FIG. 1C is a cross-sectional view illustrating that an excessive etch phenomenon occurs due to difference of etch rates of the sacrificial oxide layer and the mold oxide of FIG. 1B.

Figure 1D:
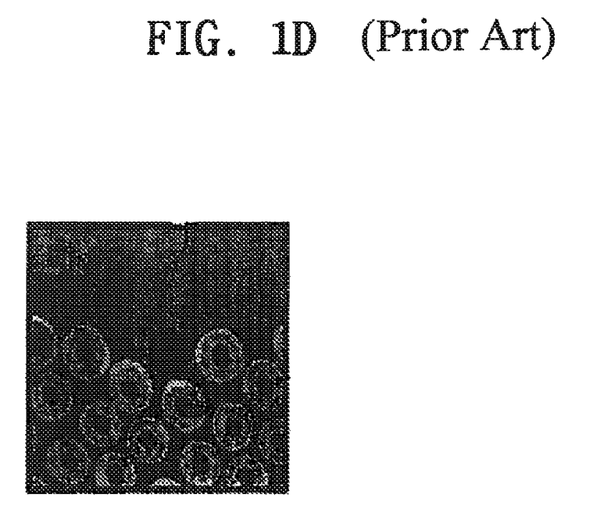
FIG. 1D is a photograph illustrating that, in the conventional art, a hole is formed in an interlayer insulating layer due to the excessive etch phenomenon of FIG. 1C.
Figure 1E:
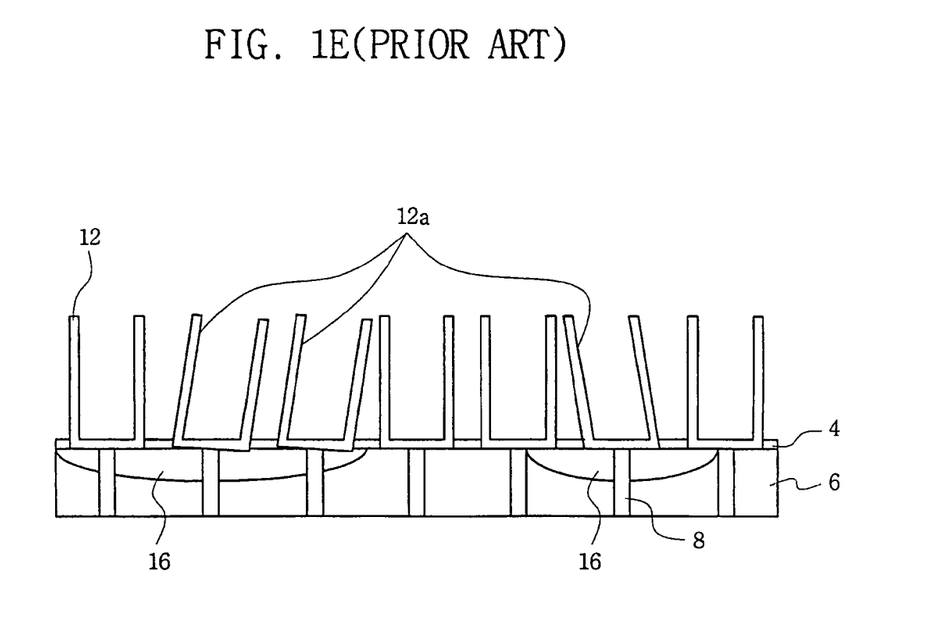
FIG. 1E is a cross-sectional view illustrating that, in the conventional art, capacitor lower electrodes may be inclined due to the excessive etch phenomenon of FIG. 1C.
Figure 1F:
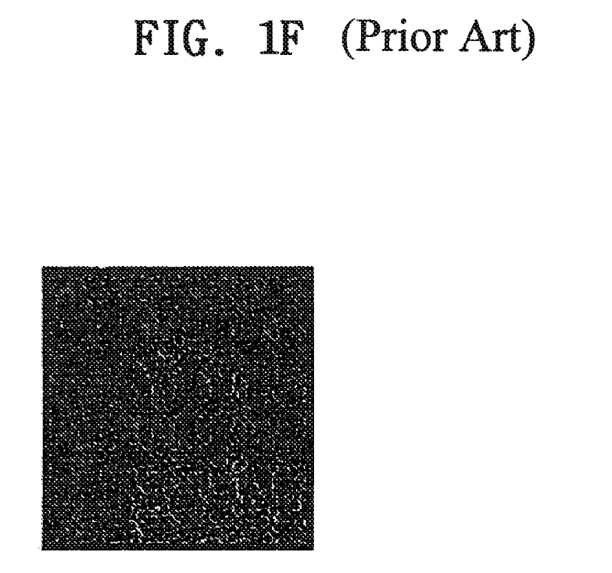
FIG. 1F is a photograph illustrating that, in the conventional art, an eyebrow defect phenomenon occurs due to the leaning phenomenon of FIG. 1E.

FIG. 1D is a photograph illustrating that a hole is formed in an interlayer insulating layer due to the excessive etch phenomenon shown in FIG. 1C. FIG. 1E is a cross-sectional view illustrating that capacitor lower electrodes are inclined due to the excessive etch phenomenon shown in FIG. 1C. FIG. 1F is a photograph illustrating that a leaning hole phenomenon (a so-called eyebrow defect phenomenon) occurs due to the leaning phenomenon of FIG. 1E.

In view of the excessive etch phenomenon in reference to FIGS. 1A to 1F, a lower structure for forming the capacitor lower electrode is formed on the semiconductor substrate. That is, a buried contact 8 composed of polysilicon is formed to be connected with a transistor of a memory cell on the semiconductor substrate. An etch stop layer 4 is formed on the buried contact 8 to restrict an etch range, and a mold oxide layer 2 is formed on the etch stop layer 4. Here, the etch stop layer 4 is normally composed of silicon nitride (SiN). The mold oxide layer 2 is normally composed of a BPSG insulating layer and a TEOS insulating layer.

Then, a series of photolithography processes is performed on the mold oxide layer 2, thereby forming an etch hole. Next, a first conductive layer 10 is deposited on the overall surface of the etch hole. The first conductive layer 10 and the buried contact 8 react during deposition of the first conductive layer 10, thereby forming a $TiSi_x$ (for example, $TiSi_2$) layer 7.

A second conductive layer 12 as a prototype of a cylinder-structured lower electrode is deposited on the surface of the first conductive layer 10. A sacrificial oxide layer 14 is interposed between the walls of the second conductive layer 12. The sacrificial oxide layer 14 prevents the second conductive layer 12 from being exposed to an etch solution, and prevents an interlayer insulating layer 6 and the $TiSi_x$ layer 7 from being etched, and is ultimately removed by an LAL solution.

When the sacrificial oxide layer 14 is etched using an etch solution (in this case, a method of removal using an LAL solution is normally used.), the sacrificial oxide layer 14 and the mold oxide layer 2 have different etch rates. That is, the sacrificial oxide layer 14 is etched faster than the mold oxide layer 2. Thus, while the second conductive layer 12 of the cylinder-structured capacitor lower electrode is exposed and the mold oxide layer 2 is etched, the etch solution penetrates through into the second conductive layer 12 and the first conductive layer 10 and reaches the $TiSi_x$ layer 7 and the interlayer insulating layer 6, thereby sequentially etching the $TiSi_x$ layer 7 and the interlayer insulating layer 6.

As described above, since the sacrificial oxide layer 14 is first etched before the mold oxide layer 2 in the conventional method of forming a lower electrode of a capacitor, a problem occurs of an excessive etch phenomenon where the interlayer insulating layer and the $TiSi_x$ layer of the cylinder-structured capacitor lower electrode are etched (see, e.g., FIG. 1C at 16).

Further, a leaning hole phenomenon occurs due to the excessive etch phenomenon, in which the cylinder-structured capacitor lower electrodes are inclined, thereby causing failures of the capacitor lower electrodes (see, e.g., FIG. 1B at 12a), interfering with production yields of these semiconductor memory devices.

SUMMARY

Therefore, embodiments of the present invention are directed to providing methods of forming a lower electrode of a capacitor for reducing or minimizing an excessive etch phenomenon.

Another feature of the present invention is to provide methods of forming a lower electrode of a capacitor for reducing or minimizing a leaning hole phenomenon.

One exemplary embodiment of the present invention provides a method of forming a lower electrode of a capacitor in a semiconductor memory device including etching a mold oxide layer to have unevenly etched side walls, thereby forming a plurality of etch holes having a cylinder structure with a varying radius; sequentially depositing a conductive layer and a sacrificial oxide layer on the overall surface of the plurality of etch holes, and then etching upper portions of the plurality of etch holes, thereby exposing an upper portion of the mold oxide layer and an upper portion of the sacrificial oxide layer. Then forming a mask on the mold oxide layer and on the sacrificial oxide layer to prevent the sacrificial oxide layer from being etched; etching the mask on the mold oxide layer and the mold oxide layer; and etching the mask on the sacrificial oxide layer and the sacrificial oxide layer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

The present invention will now be described with reference to the accompanying drawings, in which preferred embodiments of the invention are shown. However, the invention should not be construed as limited to only the embodiments set forth herein. Rather, these embodiments are presented as teaching examples. In the drawings, like numbers refer to like elements.

FIGS. 2A to 2K are cross-sectional views illustrating a method of forming a lower electrode of a capacitor sequentially according to an embodiment of the present invention.

Figure 2A:
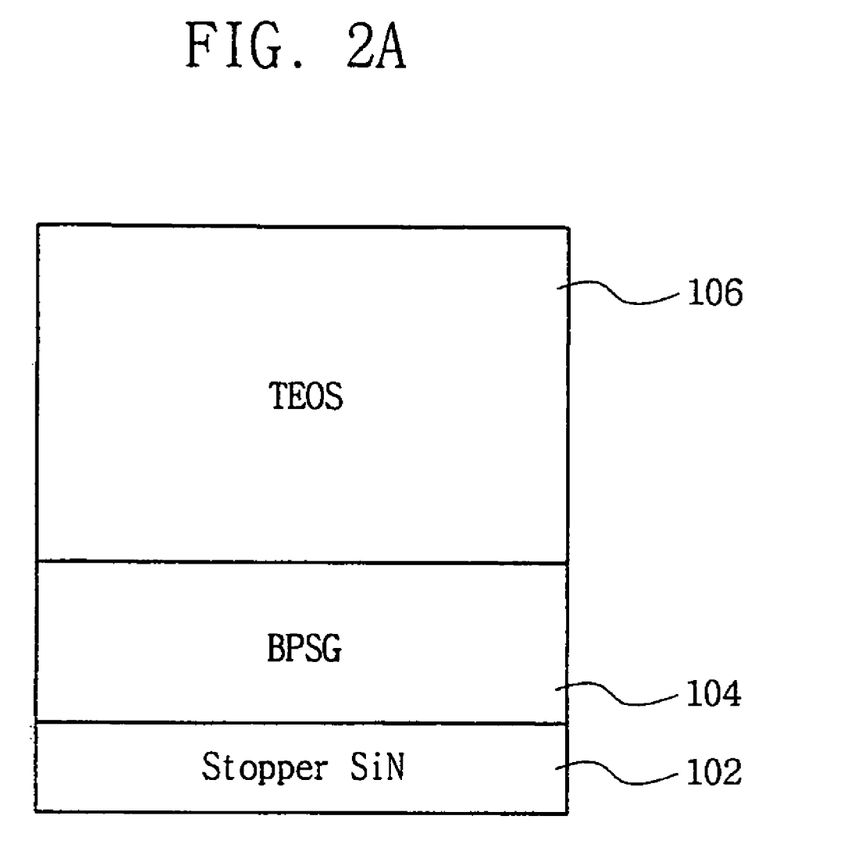
FIG. 2A is a cross-sectional view illustrating that a mold oxide layer composed of a BPSG insulating layer and a TEOS insulating layer is formed on an etch stop layer to form a lower electrode of a capacitor according to an embodiment of the present invention.
Figure 2B:
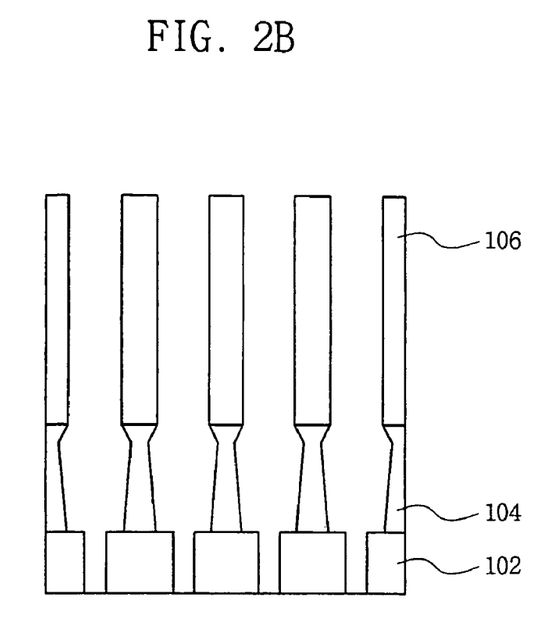
FIG. 2B is a cross-sectional view illustrating that a photolithography process is performed on the resultant structure of FIG. 2A, and thus a plurality of etch holes are formed.

FIG. 2A is a cross-sectional view illustrating that a mold oxide layer composed of a BPSG insulating layer and a TEOS insulating layer is formed on an etch stop layer, in other words, an etch stopper. The stacking of the mold oxide layer is preferably performed using a chemical vapor deposition (CVD) process. Preferably, a lower layer of the mold oxide layer is a BPSG insulating layer 104, and an upper layer of the mold oxide layer is a TEOS insulating layer 106. The etch stop layer 102 is preferably composed of silicon nitride (SiN). The etch stop layer 102 restricts etching to above the etch stop layer. The TEOS insulating layer 106 is intended to increase the surface area of the lower electrode, and thus the capacitance, of a capacitor because the BPSG insulating layer 104 and the TEOS insulating layer 106 have different etch rates: As shown in FIG. 2B, since the etch rate of the BPSG insulating layer 104 is more than that of the TEOS insulating layer 106, the BPSG insulating layer 104 is etched to a greater degree, so that the surface area of the capacitor lower electrode is increased.

FIG. 2B is a cross-sectional view illustrating that a photolithography process is performed on the resultant structure of FIG. 2A and thus, a plurality of etch holes are formed as a cylinder structure. Referring to FIG. 2B, a series of a photolithography processes is performed on the mold oxide layers 104 and 106, and on the etch stop layer 102 so that a plurality of cylindrical-shaped etch holes are formed. The etch holes extend to the etch stop layer 102. The etch hole is formed with a varying diameter. That is, the etch stop layer 102 is etched least, and the BPSG insulating layer 104 is etched the most so that the etch hole has unevenly etched sidewalls. In other words, the etch holes resemble a cylinder with a changing diameter along its height. This is intended to increase the surface area of the capacitor's lower electrode, thereby increasing the capacitance of the capacitor as described above.

Figure 2C:
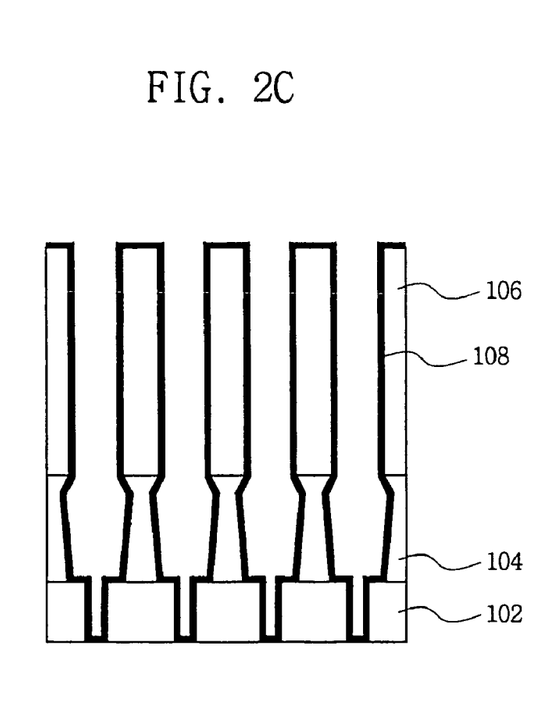
FIG. 2C is a cross-sectional view illustrating that a conductive layer as a prototype of a plurality of cylindrical-shaped capacitor lower electrodes is formed on the overall surface of the etch holes of FIG. 2B.

FIG. 2C is a cross-sectional view illustrating that a conductive layer as a prototype of a plurality of cylindrical-shaped capacitor lower electrodes is formed on the overall surface of the etch holes of FIG. 2B. The conductive layer 108 is preferably composed of titanium or titanium nitride. The conductive layer 108 is preferably formed by deposition.

Figure 2D:
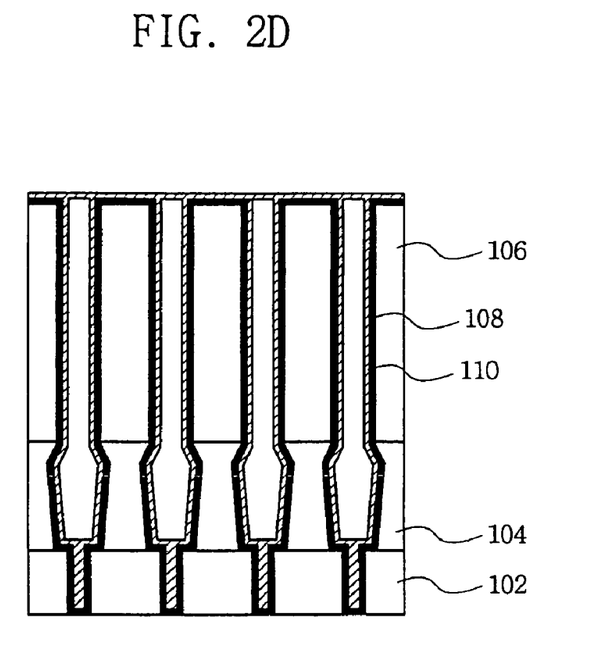
FIG. 2D is a cross-sectional view illustrating that a sacrificial oxide layer is deposited on the conductive layer having the plurality of etch holes of FIG. 2C.

FIG. 2D is a cross-sectional view illustrating that a sacrificial oxide layer 110 is deposited on the conductive layer having the plurality of etch holes of FIG. 2C. The sacrificial oxide layer 110 is preferably an oxide layer formed by an atomic layer deposition (ALD) method. Note that FIG. 2D is a schematic, showing that sacrificial oxide layer 110 will, in general, bridge the gap over the etch holes FIG. 2E is a cross-sectional view illustrating that a portion of the sacrificial oxide layer of FIG. 2D is etched.

Figure 2E:
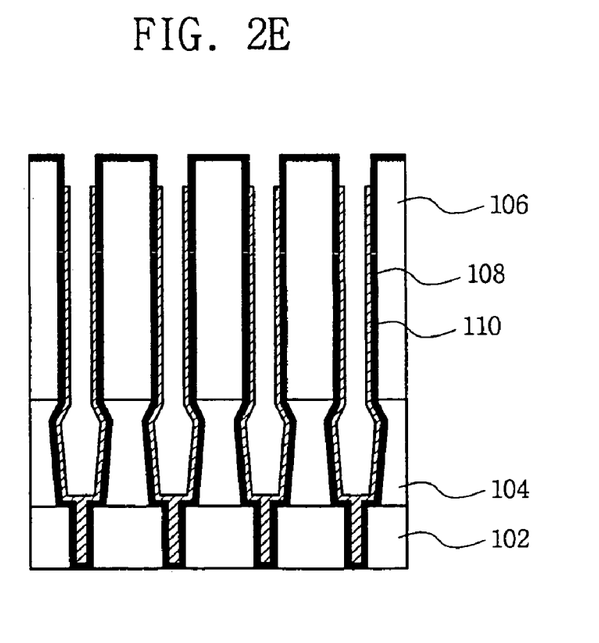
FIG. 2E is a cross-sectional view illustrating that a portion of the sacrificial oxide layer of FIG. 2D is etched.

Referring to FIG. 2E, the sacrificial oxide layer 110 on the conductive layer 108 is etched as much as needed to expose an upper portion of the conductive layer 108. Thus, the upper portion of the conductive layer 108 is in a state to be etched.

Figure 2F:
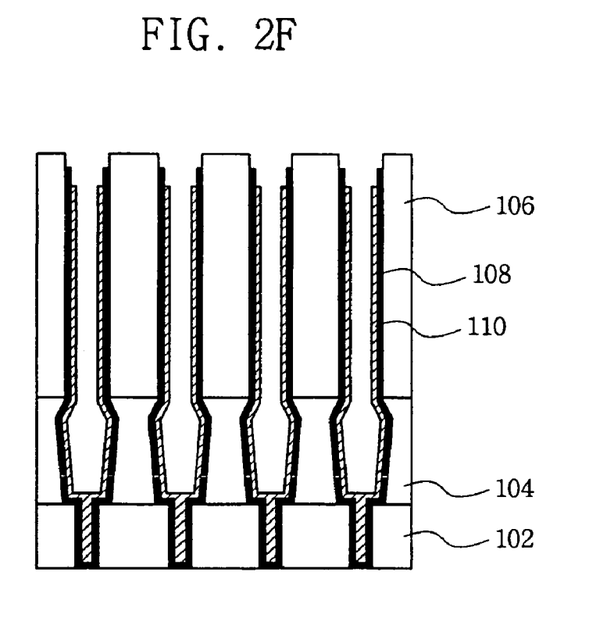
FIG. 2F is a cross-sectional view illustrating that an upper portion of the conductive layer of FIG. 2E is etched to expose an upper portion of the TEOS insulating layer.

FIG. 2F is a cross-sectional view illustrating that an upper portion of the conductive layer of FIG. 2E is etched to expose an upper portion of the TEOS insulating layer. Referring to FIG. 2F, since the TEOS insulating layer 106 must be exposed to be etched, it is shown that the conductive layer 108 having an exposed upper portion is etched as a preliminary step of etching the TEOS insulating layer 106.

If the TEOS insulating layer 106, the BPSG insulating layer 104, and the sacrificial oxide layer 110 are all in a state to be etched by an etch solution, since an etch rate of the sacrificial oxide layer 110 is higher than those of the TEOS insulating layer 106 and the BPSG insulating layer 104, the sacrificial oxide layer 110 is etched first. Thus, before the TEOS insulating layer 106 and the BPSG insulating layer 104 are all etched, the conductive layer 108 covered with the sacrificial oxide layer 110 is exposed. Thus, the etch solution is injected into the etch holes, and absorbed into the surface of the conductive layer 108, and finally, reaches a $TiSi_x$ layer (refer to numerical number '7' of FIG. 1) as titanium oxide below the etch stop layer 102, and an interlayer insulating layer (refer to numerical number '6' of FIG. 1).

Thus, when the $TiSi_x$ layer and the interlayer insulating layer are etched by the etch solution, an excessive etch phenomenon occurs. Because of this, to prevent the excessive etch phenomenon, a mask is necessary for the sacrificial oxide interposed inside the hole not to be etched by the same etch process as on the mold oxide layers 104, 106.

Figure 2G:
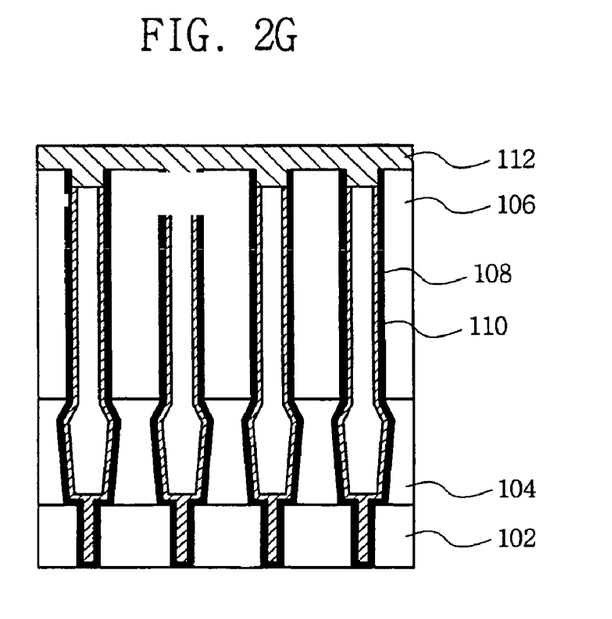
FIG. 2G is a cross-sectional view illustrating that a mask for use as an etch mask is deposited on the overall surface of the externally exposed upper portion of FIG. 2F.

FIG. 2G is a cross-sectional view illustrating that a mask 112 for use as an etch mask is deposited on the overall surface of the externally exposed upper portion of FIG. 2F. Here, the mask 112 may be formed by deposition of an amorphous carbon layer, polysilion, or SiON.

Figure 2H:
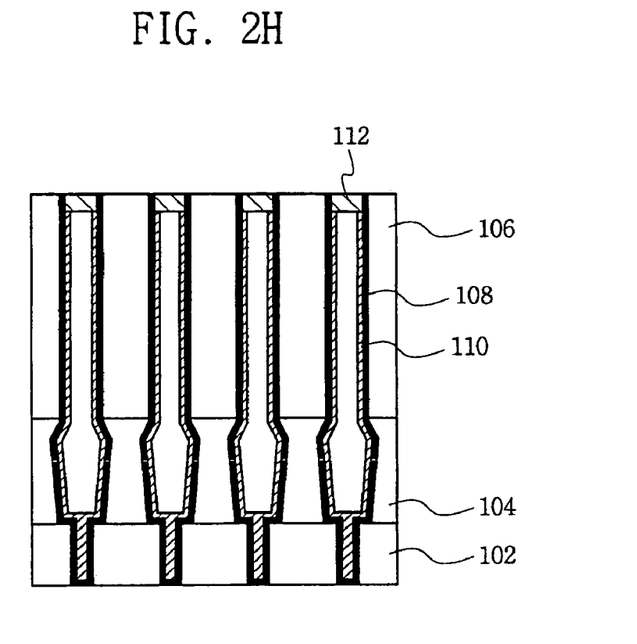
FIG. 2H is a cross-sectional view illustrating that a portion of the mask is etched so that the TEOS insulating layer is exposed in FIG. 2G.

FIG. 2H is a cross-sectional view illustrating that a portion of the mask 112 is etched so that the TEOS insulating layer 106 is exposed in FIG. 2G. That is, since the mask 112 is deposited on all portions of the conductive layer 108, the TEOS insulating layer 106, and the sacrificial oxide layer 110 in FIG. 2G, the portion of the mask 112 over the TEOS insulating layer 106 is etched to etch the mold oxide layer including the TEOS insulating layer 106. Thus, since the mask 112 is left on the sacrificial oxide layer 110, and the mask on the TEOS insulating layer 106 is etched, the TEOS insulating layer 106 is ready to be etched.

Figure 2I:
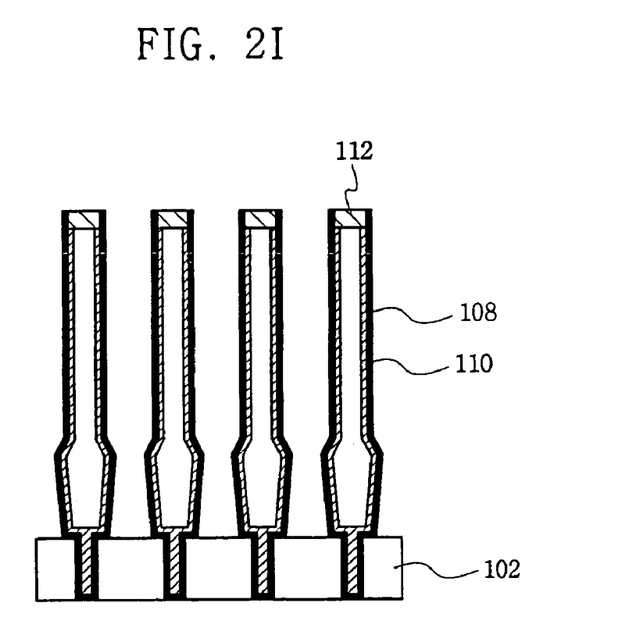
FIG. 2I is a cross-sectional view illustrating that the mold oxide layer is etched in FIG. 2H.

FIG. 2I is a cross-sectional view illustrating that the mold oxide layer is etched. That is, the mold oxide layer being composed of the TEOS insulating layer 106 and the BPSG insulating layer 104 is etched. Thus, with the presence of the mask 112 left on the sacrificial oxide layer 110, only the mold oxide layer is etched, and the sacrificial oxide layer 110 is not etched.

Figure 2J:
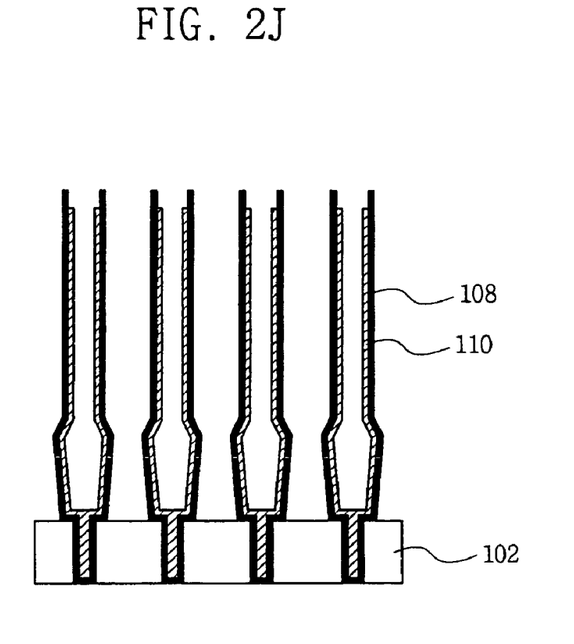
FIG. 2J is a cross-sectional view illustrating that the mask on the sacrificial oxide layer is etched in FIG. 2I.

FIG. 2J is a cross-sectional view illustrating that the mask 112 on the sacrificial oxide layer is etched. That is, the mask 112 on the sacrificial oxide layer 110 is etched to etch the sacrificial oxide layer 110. The mask 112 on the sacrificial oxide layer 110 is preferably removed by an LAL solution.

Figure 2K:
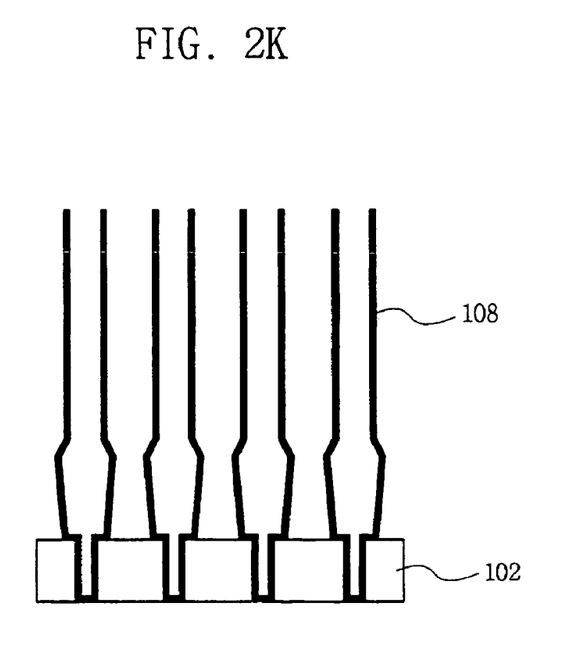
FIG. 2K is a cross-sectional view illustrating that the sacrificial oxide layer interposed inside the cylinder structure is etched in FIG. 2J.

FIG. 2K is a cross-sectional view illustrating that the sacrificial oxide layer interposed inside the cylinder structure is etched. That is, the sacrificial oxide layer 110 interposed inside the cylinder structure is etched, and the etch process is preferably performed using an LAL solution.

Subsequent processes of forming the capacitor's lower electrode after the state shown in FIG. 2K use a typical method, and a detailed description will be omitted.

As described above, embodiments of the present invention provides a method of forming a lower electrode of a capacitor, which is improved in that an excessive etch phenomenon, in which a lower interlayer insulating layer of the capacitor's lower electrode is etched because a sacrificial oxide layer is first etched before a mold oxide, can be decreased or minimized.

Further, the method of forming a lower electrode of a capacitor according to embodiments of the present invention provide an effect of suppressing or minimizing a leaning hole phenomenon, in which lower electrodes tend to be inclined due to the excessive etch phenomenon.

As a result, embodiments of the present invention provide an improved method of forming a lower electrode of a capacitor to increase production yield of these semiconductor memory devices.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation to encompass all such modifications and similar arrangements.

What is claimed is:

1. A method of forming a lower electrode of a capacitor in a semiconductor memory device, the method comprising:
    etching a mold layer to form a plurality of etch holes having a substantially cylinder structure;
    sequentially depositing a conductive layer and a sacrificial oxide layer on a surface of the plurality of etch holes;
    etching upper portions of the sacrificial oxide layer to expose upper portions of the conductive layer;
    etching the conductive layer to expose upper portions of the mold layer;
    forming a mask on the mold layer and on the sacrificial oxide layer;
    etching the mask to expose the mold layer while leaving the mask to conceal the sacrificial oxide layer;
    etching the mold layer;
    removing the mask concealing the sacrificial oxide layer; and
    removing the sacrificial oxide layer.

2. The method of forming a lower electrode of a capacitor according to claim 1, wherein the mold layer includes a BPSG insulating layer and a TEOS insulating layer, and the TEOS insulating layer is stacked on the BPSG insulating layer.

3. The method of forming a lower electrode of a capacitor according to claim 1, wherein the conductive layer comprises titanium (Ti) or titanium nitride (TiN).

4. The method of forming a lower electrode of a capacitor according to claim 1, wherein the sacrificial oxide layer is deposited using an atomic layer deposition (ALD) process.

5. The method of forming a lower electrode of a capacitor according to claim 1, wherein the mask is an amorphous carbon layer (ACL), and the ACL is formed by deposition.

6. The method of forming a lower electrode of a capacitor according to claim 1, wherein forming the mask comprises depositing polysilicon.

7. The method of forming a lower electrode of a capacitor according to claim 1, wherein forming the mask comprises depositing SiON.

8. A method of forming a lower electrode of a capacitor in a semiconductor memory device, the method comprising:
   forming a mold oxide layer on an etch stop layer;
   forming etch holes in the mold oxide layer that extend into the etch stop layer, the etch holes having substantially a cylinder structure;
   depositing a conductive layer on a surface of the etch holes;
   depositing a sacrificial oxide layer on the conductive layer;
   etching upper portions of the sacrificial oxide layer to expose an upper portion of the conductive layer;
   etching the conductive layer to expose upper portions of the mold oxide layer;
   forming a mask on the mold oxide layer and on the sacrificial oxide layer to prevent the sacrificial oxide layer from being etched;
   etching the mask to expose the mold oxide layer;
   etching the mold oxide layer;
   etching the mask; and
   etching the sacrificial oxide layer.

9. The method of forming a lower electrode of a capacitor according to claim 8, wherein the etch stop layer comprises silicon nitride (SiN).

10. The method of forming a lower electrode of a capacitor according to claim 8, wherein the mold oxide layer comprises an upper mold oxide layer and a lower mold oxide layer, the upper mold oxide layer being a TEOS insulating layer.

11. The method of forming a lower electrode of a capacitor according to claim 8, wherein the sacrificial oxide layer is deposited by an ALD process.

12. The method of forming a lower electrode of a capacitor according to claim 8, wherein the conductive layer comprises titanium (Ti) or titanium nitride (TiN).

13. The method of forming a lower electrode of a capacitor according to claim 8, wherein the mask comprises an amorphous carbon layer (ACL) formed by deposition.

14. The method of forming a lower electrode of a capacitor according to claim 8, wherein forming the mask comprises depositing polysilicon.

15. The method of forming a lower electrode of a capacitor according to claim 8, wherein forming the mask comprises depositing SiON.

16. A method of forming a lower electrode of a capacitor in a semiconductor memory device, the method comprising:
   forming a lower structure;
   forming an etch stop layer to restrict an etch range on the lower structure;
   forming a mold oxide layer on the etch stop layer;
   forming etch holes having a cylinder structure that extends through the mold oxide layer to the etch stop layer;
   forming a conductive layer on a surface of the etch holes;
   depositing a sacrificial oxide layer on a surface of the conductive layer;
   etching an upper portion of the conductive layer to expose an upper portion of the mold oxide layer;
   forming a mask on the mold oxide layer, the conductive layer, and the sacrificial oxide layer;
   etching the mask on the mold oxide layer;
   etching the mold oxide layer using the mask as an etch mask;
   etching the mask formed on the sacrificial oxide layer; and
   etching the sacrificial oxide layer deposited in the holes.

17. The method of forming a lower electrode of a capacitor according to claim 16, wherein the mold oxide layer comprises a BPSG insulating layer and a TEOS insulating layer, and the TEOS insulating layer is stacked on the BPSG insulating layer.

18. The method of forming a lower electrode of a capacitor according to claim 16, wherein the mask is an amorphous carbon layer (ACL) formed by deposition.

19. The method of forming a lower electrode of a capacitor according to claim 16, wherein forming the mask comprises deposition of polysilicon or SiON.

20. The method of forming a lower electrode of a capacitor according to claim 16, wherein the conductive layer comprises titanium (Ti) or titanium nitride (TiN).

21. The method of forming a lower electrode of a capacitor according to claim 16, wherein the cylinder structure has more than one radius.

22. The method of forming a lower electrode of a capacitor according to claim 1, wherein forming the mask comprises forming a portion of the mask within the plurality of etch holes.

* * * * *